(12) United States Patent
Stiatti et al.

(10) Patent No.: US 10,300,903 B2
(45) Date of Patent: May 28, 2019

(54) SUPPORT STRUCTURE OF ELECTROHYDRAULIC APPARATUSES FOR IRRIGATION SYSTEMS, APPLICABLE TO A BURIABLE WELL FOR HOUSING AND PROTECTING SUCH ELECTROHYDRAULIC APPARATUSES

(71) Applicants: Anna Stiatti, Milan (IT); Matteo Maria Stiatti, Duno (IT); Alberto Stiatti, Milan (IT)

(72) Inventors: Anna Stiatti, Milan (IT); Matteo Maria Stiatti, Duno (IT); Alberto Stiatti, Milan (IT)

( * ) Notice: Subject to any disclaimer, the term of this patent is extended or adjusted under 35 U.S.C. 154(b) by 0 days.

(21) Appl. No.: 15/209,330

(22) Filed: Jul. 13, 2016

(65) Prior Publication Data
US 2017/0016202 A1 Jan. 19, 2017

(30) Foreign Application Priority Data
Jul. 14, 2015 (IT) .................. 202015000034085

(51) Int. Cl.
*A01G 25/16* (2006.01)
*B60W 10/06* (2006.01)
(Continued)

(52) U.S. Cl.
CPC .............. *B60W 10/06* (2013.01); *A01G 25/00* (2013.01); *A01G 25/16* (2013.01); *B62K 11/02* (2013.01); *B65D 25/28* (2013.01); *B65D 88/76* (2013.01); *E02D 29/12* (2013.01); *E02D 29/14* (2013.01); *E02D 29/1454* (2013.01); *E03B 7/095* (2013.01); *E03B 9/08* (2013.01); *E03B 9/10* (2013.01); *E03B 11/14* (2013.01); *H02G 9/02* (2013.01); *H02G 9/10* (2013.01); *H05K 5/0217* (2013.01); *B60W 2300/36* (2013.01); *B62K 2207/00* (2013.01); *B65D 2525/283* (2013.01); *Y02A 20/104* (2018.01); *Y10T 137/6995* (2015.04)

(58) Field of Classification Search
CPC ......... Y10T 137/6851; Y10T 137/6995; E03B 7/095; A01G 25/16
See application file for complete search history.

(56) References Cited

U.S. PATENT DOCUMENTS 4,840,345 A * 6/1989 Neil .................. F16L 3/12
  24/16 PB
4,872,575 A * 10/1989 Kobilan ................ H02G 9/10
  220/23.86

(Continued)

*Primary Examiner* — Kevin F Murphy
(74) *Attorney, Agent, or Firm* — Lucas & Mercanti, LLP

(57) ABSTRACT

Support structures for electrohydraulic apparatuses in particular of electrical and hydraulic apparatuses of irrigation systems are disclosed. The support structure is configured to be applied to a buriable well for housing and protecting such electrohydraulic apparatuses. On predetermined portions of the support structure a plurality of holes are formed, and are adapted for receiving a corresponding plurality of support means configured to hold, preferably in a releasable manner, one or more electrohydraulic apparatuses. Also described is a buriable well for housing and protecting electrohydraulic apparatuses comprising at least one such support structure of electrohydraulic apparatuses.

12 Claims, 5 Drawing Sheets

(51) Int. Cl.

| | |
|---|---|
| *A01G 25/00* | (2006.01) |
| *E02D 29/12* | (2006.01) |
| *E02D 29/14* | (2006.01) |
| *E03B 7/09* | (2006.01) |
| *E03B 9/08* | (2006.01) |
| *E03B 9/10* | (2006.01) |
| *E03B 11/14* | (2006.01) |
| *H02G 9/10* | (2006.01) |
| *B62K 11/02* | (2006.01) |
| *B65D 25/28* | (2006.01) |
| *B65D 88/76* | (2006.01) |
| *H02G 9/02* | (2006.01) |
| *H05K 5/02* | (2006.01) |

(56) References Cited

U.S. PATENT DOCUMENTS

| | | | | |
|---|---|---|---|---|
| 6,035,887 | A | * | 3/2000 | Cato ............... E03B 7/08 137/343 |
| 6,460,563 | B2 | * | 10/2002 | Olson ............. A01G 25/16 137/364 |
| 7,004,677 | B1 | * | 2/2006 | Ericksen ......... A01G 25/162 137/364 |
| 8,567,432 | B2 | * | 10/2013 | Ericksen ......... F16K 27/12 137/343 |
| 2011/0197975 | A1 | * | 8/2011 | Stiatti ............. E02D 29/12 137/371 |

* cited by examiner

SUPPORT STRUCTURE OF ELECTROHYDRAULIC APPARATUSES FOR IRRIGATION SYSTEMS, APPLICABLE TO A BURIABLE WELL FOR HOUSING AND PROTECTING SUCH ELECTROHYDRAULIC APPARATUSES

CROSS-REFERENCE TO RELATED APPLICATIONS

This application claims the benefit of priority from Italian Utility Model Application No. 202015000034085 filed on Jul. 14, 2015, the contents of which are incorporated herein by reference.

FIELD OF THE INVENTION

The present invention refers to a support structure of electrohydraulic apparatuses, in particular electrical and hydraulic apparatuses of irrigation systems, applicable to a buriable well for housing such electrohydraulic apparatuses.

BACKGROUND OF THE INVENTION

To house solenoid valves, taps, hydrants and other apparatuses of an irrigation system that need to be buried, it is known to use wells having the purpose of allowing access to such apparatuses and protecting them from the soil and from detritus. Such wells normally comprise a main body for housing apparatuses, which has one or more lower openings, to allow the passage of the electrical and hydraulic supply lines of the apparatuses themselves, and an upper opening, closed by a cover able to be walked upon and opened for inspection and maintenance operations. Known wells are built in various shapes and sizes, depending on the number and the size of the apparatuses that they are intended to house, and are usually obtained by injection molding of thermoplastic materials, since such materials are insensitive to corrosion phenomena due to burying.

In some known buriable wells the apparatuses of the irrigation system are rested directly on the ground through the lower opening with which the well is equipped. In the case of solenoid valves, therefore, it is possible that detritus or other dirt present on the ground might compromise the correct operation thereof, requiring frequent maintenance interventions.

Therefore, buriable wells have been made that are internally provided with support structures for the apparatuses of the irrigation system, in particular for the solenoid valves. In these buriable wells, however, the apparatuses are simply arranged resting on the respective support structure. In other words, although these support structures, typically made in the form of grids, are configured to keep the apparatuses at a predetermined distance from the ground, it is not possible to exclude the possibility of even small movements of the apparatuses themselves still bringing them in contact with detritus or other dirt.

SUMMARY OF THE INVENTION

The general purpose of the present invention is therefore to make a support structure of electrohydraulic apparatuses, in particular electrical and hydraulic apparatuses of irrigation systems, which is applicable to a buriable well for housing and protecting such electrohydraulic apparatuses so as to overcome the aforementioned drawbacks of the prior art in an extremely simple, cost-effective and particularly functional manner.

In particular, a purpose of the present invention is to make a support structure of electrohydraulic apparatuses for irrigation systems that is capable of avoiding, or at least reducing, the contact of such apparatuses with detritus or other dirt present on the ground.

Another purpose of the invention is to make a support structure of electrohydraulic apparatuses for irrigation systems that is capable of preventing possible undesired movements of such apparatuses when in use.

These purposes according to the present invention are accomplished by making a support structure of electrohydraulic apparatuses, in particular electrical and hydraulic apparatuses of irrigation systems, as outlined in claim 1.

Further characteristics of the invention are highlighted by the dependent claims, which are an integral part of the present description.

BRIEF DESCRIPTION OF THE DRAWINGS

The characteristics and advantages of a support structure of electrohydraulic apparatuses for irrigation systems according to the present invention will become clearer from the following description, given as an example and not for limiting purposes, referring to the attached schematic drawings, in which.

DETAILED DESCRIPTION OF THE INVENTION

Figure 1:
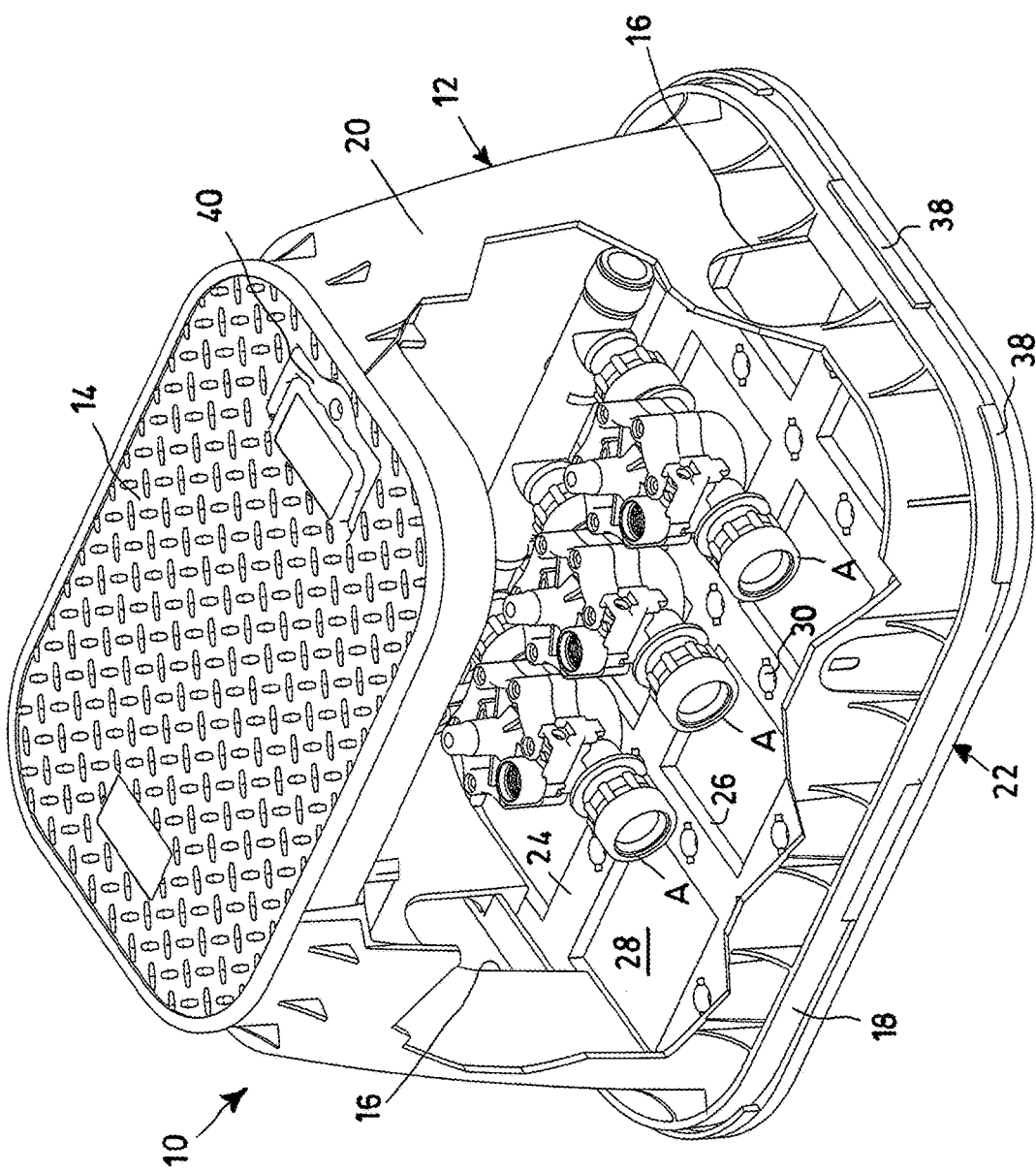
FIG. 1 is a perspective view, partially in section, of a buriable well for housing and protecting electrohydraulic apparatuses to which a support structure of such electrohydraulic apparatuses is applied according to the present invention.
Figure 2:
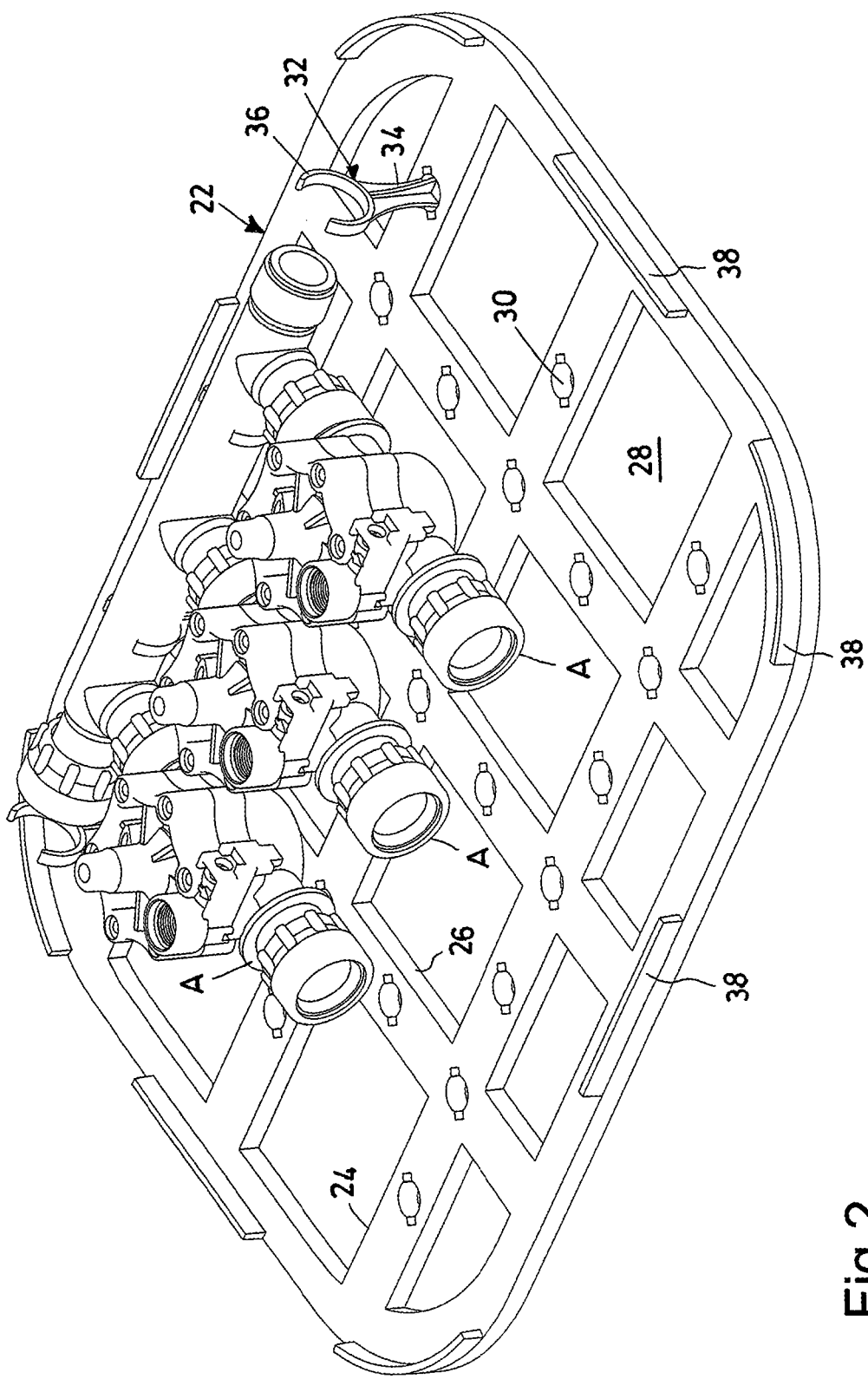
FIG. 2 is a perspective view of a support structure of electrohydraulic apparatuses according to the present invention, applicable to a generic well like that of FIG. 1 and configured in particular for supporting solenoid valves.
Figure 3:
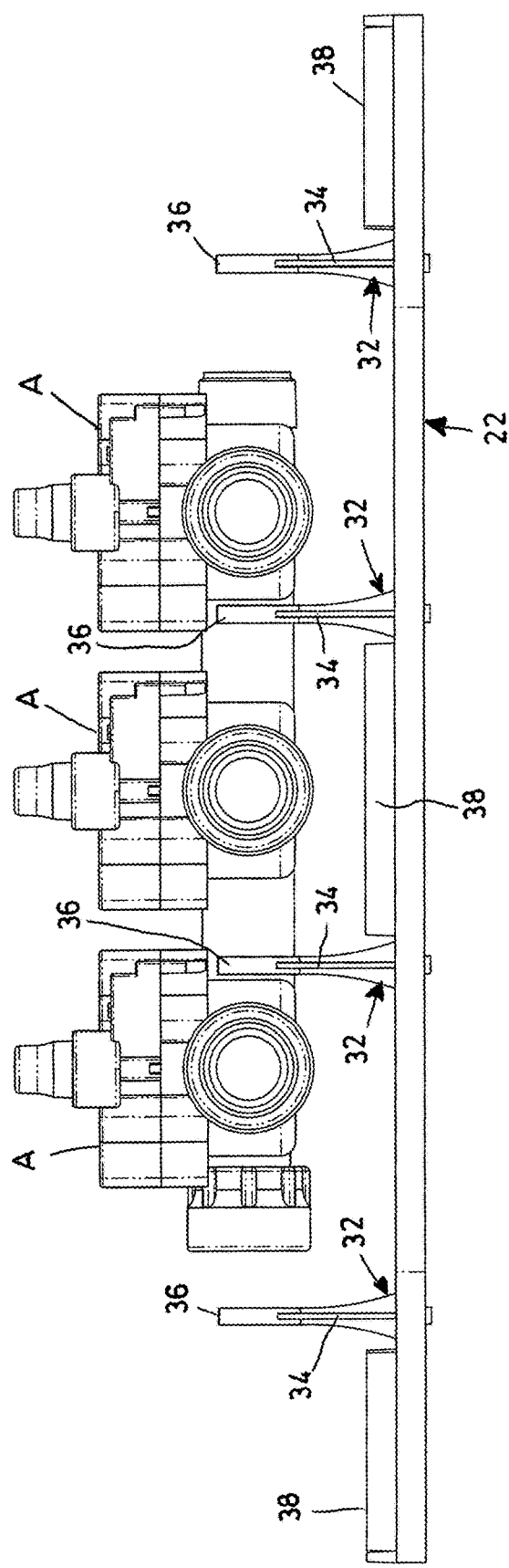
FIG. 3 is a front view of the support structure of FIG. 2.
Figure 4:
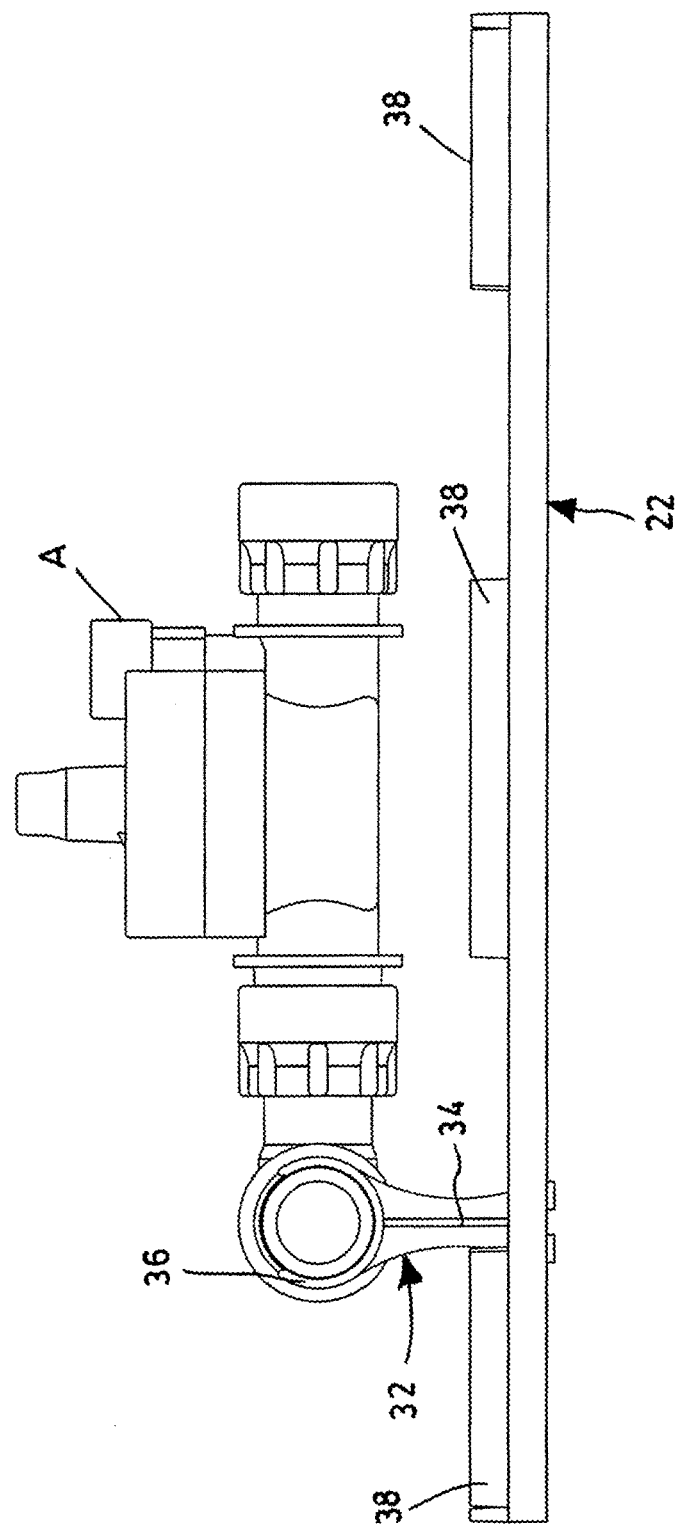
FIG. 4 is a side view of the support structure of FIG. 2.
Figure 5:
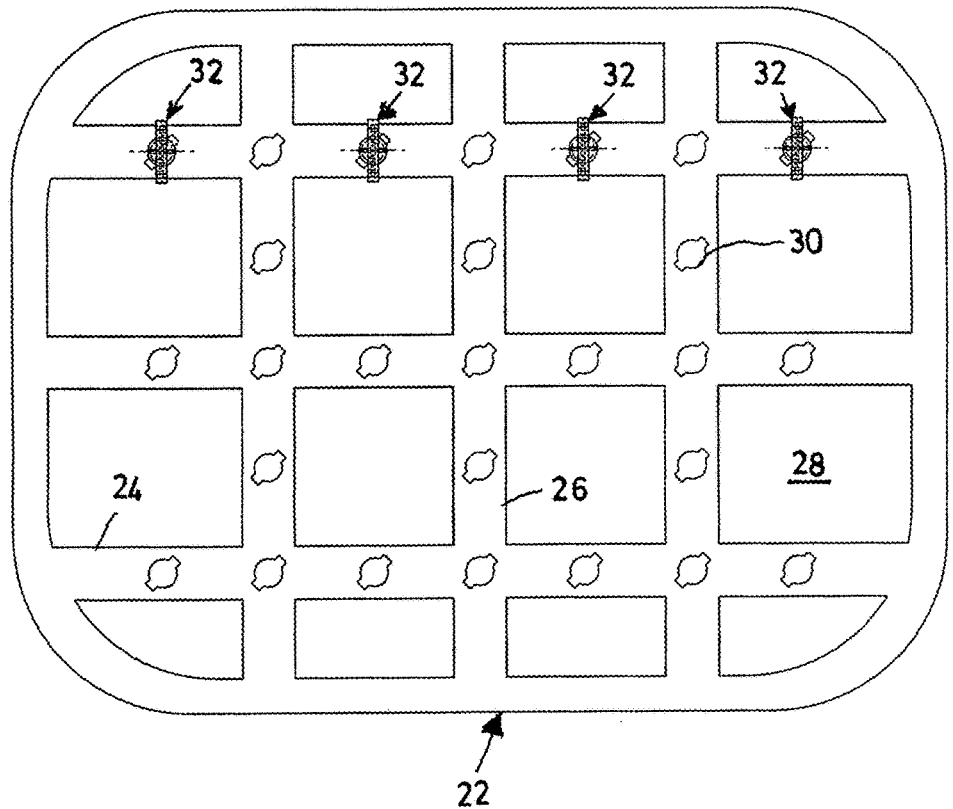
FIG. 5 is a plan view from above of the support structure of FIG. 2, shown without the solenoid valves.
Figure 6:
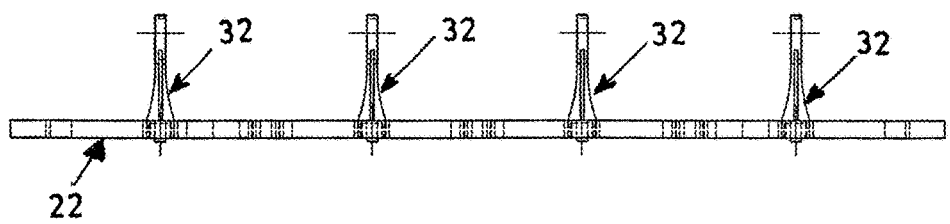
FIG. 6 is a front view of the support structure of FIG. 5.
Figure 7:
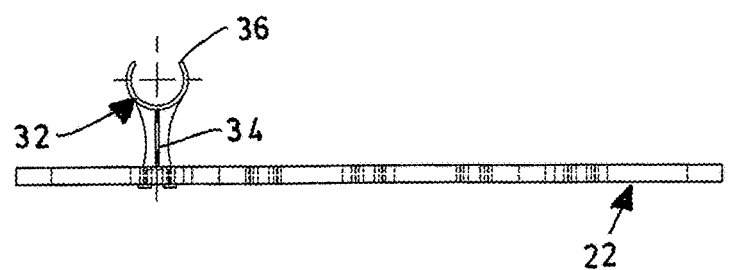
FIG. 7 is a side view of the support structure of FIG. 5.

With reference in particular to FIG. 1, a buriable well for housing and protecting electrohydraulic apparatuses is shown, wholly indicated with reference numeral 10, to which a support structure of such electrohydraulic apparatuses according to the present invention can be applied.

The well 10 comprises a main body 12 for housing the electrohydraulic apparatuses and a cover 14, applied onto an upper opening of such a main body 12. The main body 12 can also be provided with one or more further openings 16, provided on the base 18 and/or on the side walls 20 of the main body 12 itself, to allow the passage of the electrical and/or hydraulic supply lines of the apparatuses contained inside the well 10.

Both the main body 12 and the cover 14 are preferably made through injection molding of thermoplastic materials, although this does not exclude the use of other suitable materials depending on the intended use of the well 10. Generally, the base 18 of the main body 12 has a larger surface than that of the cover 14 so that, when buried, the well 10 is particularly stable, validly opposing any possible attempt to remove it from the ground.

Inside the main body 12, preferably at the base 18, at least one support structure 22 for the electrohydraulic apparatuses is inserted. The support structure 22 is advantageously made in the form of a grid consisting of a plurality of longitudinal ribs 24 and a plurality of transverse ribs 26 interconnected to each other. Preferably, the longitudinal ribs 24 are perpendicular to the transverse ribs 26, so that between the longitudinal ribs 24 and the transverse ribs 26 a plurality of windows 28 are formed having a rectangular or square shape.

According to the invention, on predetermined portions of the support structure 22 a plurality of holes 30 are formed adapted for receiving a corresponding plurality of support means 32 configured to hold, preferably in a releasable manner, one or more electrohydraulic apparatuses, in particular but not exclusively solenoid valves A. Preferably, the holes 30 are formed on at least part of the longitudinal ribs 24 and/or the transverse ribs 26 of the support structure 22 when made in the form of a grid.

Again preferably, each support means 32 is provided at the bottom with a stem 34 able to be snap-fitted with a respective hole 30. Above the stem 34, formed as an enbloc therewith, there is a fork 36 configured to receive an electrohydraulic apparatus or a portion thereof. The support means 32 can thus be arranged as desired in the plurality of holes 30 provided on the support structure 22, so as to be able to create variable support configurations with the variation of the type and amount of electrohydraulic apparatuses to be installed inside the well 10.

Each support means 32 and, in particular, the respective fork 36, can be configured to hold an electrohydraulic apparatus or a portion thereof by snap-fitting, or by shape coupling. However, this does not exclude the possibility for the support means 32 to hold the electrohydraulic apparatuses in another way, like for example through grippers, tapes, adhesive substances and other.

The support structure 22 can be snap-fitted with the main body 12 or, more simply and as illustrated in the figures, constitutes a floor on which such a main body 12 is supported once the well 10 has been buried. In this last case, on the perimeter edge of the support structure 22 there can be a plurality of tabular projections 38 that, cooperating with the base 18 of the main body 12, prevent possible misalignments between such a main body 12 and the support structure 22.

On the cover 14 there can be at least one lifting handle 40 capable of facilitating the opening and closing of the cover 14 itself to carry out maintenance operations on the apparatuses contained in the main body 12 of the well 10. The lifting handle 22 can be rotatably connected to the cover 14 to pass from an operative position, in which such a lifting handle 22 is raised with respect to the cover 14 so as to be able to be gripped by an operator, to an inoperative position, in which such a lifting handle 22 is folded over the cover 14. Preferably, in its inoperative or folded position, the lifting handle 22 is housed inside a suitable cavity provided on the cover 14.

Like the main body 12 and the cover 14, the support structure 22 and the respective support means 32 can also preferably be made through injection molding of thermoplastic materials. Also in this case, however, this does not exclude the use of other suitable materials, in particular adaptable to the type of support means 32 and the respective method of holding the electrohydraulic apparatuses.

It has thus been seen that the support structure of electrohydraulic apparatuses for irrigation systems according to the present invention achieves the purposes highlighted earlier, protecting the electrohydraulic apparatuses from contact with dirt and detritus present on the ground when applied to a buriable well for housing and protecting such electrohydraulic apparatuses.

The support structure of electrohydraulic apparatuses for irrigation systems of the present invention thus conceived can in any case undergo numerous modifications and variants, all of which are covered by the same innovative concept; moreover, all of the details can be replaced by technically equivalent elements, while the shapes and sizes can be whatever according to the technical requirements.

The scope of protection of the invention is therefore defined by the attached claims.

The invention claimed is:

1. Support structure of electrohydraulic apparatuses for irrigation systems, said support structure comprising:
a combination of (i) a floor having a length and a width, said floor being configured to couple to a buriable well for housing and protecting said electrohydraulic apparatuses, and (ii) a corresponding plurality of support means configured to hold one or more electrohydraulic apparatuses,
wherein on predetermined portions of said floor a plurality of holes is formed, adapted for receiving said corresponding plurality of support means,
wherein each of said plurality of support means comprises a stem having a first end and a second end, said first end being adapted to couple to a respective hole formed in said floor, and said second end being adapted with a fork configured to receive an electrohydraulic apparatus or a portion thereof, and
wherein said plurality of holes are formed in rows along said length and said width of said floor thereby providing variable support configurations of arrangements for said plurality of the support means,
wherein said length and width of said floor terminate at a perimeter, said floor being adapted with a plurality of tabular projections extending from said floor proximal to said perimeter; said tabular projections being configured to align coupling of said floor to a main body of said buriable well,
wherein said floor is made in the form of a grid consisting of a plurality of longitudinal ribs and a plurality of transverse ribs interconnected to each other, said plurality of holes being formed along said plurality of longitudinal ribs and said plurality of transverse ribs.

2. Support structure according to claim 1, wherein said longitudinal ribs are perpendicular to said transverse ribs, so that between said longitudinal ribs and said transverse ribs a plurality of windows having a rectangular or square shape are formed.

3. Support structure according to claim 1, wherein said holes are formed on at least part of said longitudinal ribs or of said transverse ribs of said floor.

4. Support structure according to claim 1, wherein said first end of said stem is configured to snap-fit with a respective hole in said floor thereby forming an enbloc therewith, said fork of said second end is configured to releasably receive, by snap-fitting or by shape coupling, an electrohydraulic apparatus or a portion thereof.

5. Support structure according to claim 1, wherein both said floor, and the respective support means are made through injection molding of thermoplastic materials.

6. Buriable well for housing and protecting electrohydraulic apparatuses for irrigation systems, comprising:
a main body for housing electrohydraulic apparatuses, and
a cover, applied onto an upper opening of said main body,
the main body also being provided with one or more further openings, provided on a base or on side walls of said main body, to allow the passage of electrical or hydraulic supply lines of the electrohydraulic apparatuses,
wherein inside said main body at least one support structure for the electrohydraulic apparatuses is inserted, said support structure comprising a combination of (i) a floor having a length and a width, said floor being configured to be applied to a buriable well for housing and protecting said electrohydraulic apparatuses, and (ii) a corresponding plurality of support means configured to hold one or more electrohydraulic apparatuses,
wherein on predetermined portions of said floor a plurality of holes is formed, adapted for receiving said corresponding plurality of support means,
wherein each of said plurality of support means comprises a stem having a first end and a second end, said first end being adapted to couple to a respective hole formed in said floor, and said second end being adapted with a fork configured to receive an electrohydraulic apparatus or a portion thereof,
wherein said plurality of holes are formed in rows along said length and said width of said floor thereby providing variable support configurations for different and multiple electrohydraulic apparatuses,
wherein said length and width of said floor terminate at a perimeter, said floor being adapted with a plurality of tabular projections extending from said floor proximal to said perimeter; said tabular projections being configured to align coupling of said floor to a main body of said buriable well,
wherein said floor is made in the form of a grid consisting of a plurality of longitudinal ribs and a plurality of transverse ribs interconnected to each other, said plurality of holes being formed along said plurality of longitudinal ribs and said plurality of transverse ribs.

7. Well according to claim 6, wherein said floor is snap-fitted with said main body at the base of said main body.

8. Well according to claim 6, wherein said main body is supported on said floor once said well has been buried.

9. Well according to claim 8, wherein on a perimeter edge of said floor said tabular projections cooperate with the base of the main body, preventing possible misalignments between said main body and the support structure.

10. Well according to claim 6, wherein on said cover at least one lifting handle is provided for facilitating the opening and closing of said cover to carry out maintenance operations on the electrohydraulic apparatuses contained in the main body.

11. Well according to claim 6, wherein said base of said main body has a larger surface than that of said cover.

12. Well according to claim 6, wherein both said main body, and said cover are made through injection molding of thermoplastic materials.

* * * * *